(12) United States Patent
Zhao et al.

(10) Patent No.: US 10,861,396 B2
(45) Date of Patent: *Dec. 8, 2020

(54) DRIVING METHOD OF A DISPLAY PANEL

(71) Applicant: Wuhan China Star Optoelectronics Technology Co., Ltd., Wuhan (CN)

(72) Inventors: Mang Zhao, Wuhan (CN); Lihua Zheng, Wuhan (CN); Yong Tian, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/463,370

(22) PCT Filed: Dec. 19, 2018

(86) PCT No.: PCT/CN2018/122201
§ 371 (c)(1),
(2) Date: May 23, 2019

(87) PCT Pub. No.: WO2020/107578
PCT Pub. Date: Jun. 4, 2020

(65) Prior Publication Data
US 2020/0184895 A1  Jun. 11, 2020

(30) Foreign Application Priority Data

Nov. 28, 2018 (CN) .......................... 2018 1 1436769

(51) Int. Cl.
*G09G 3/3266* (2016.01)
*G09G 3/3275* (2016.01)
(Continued)

(52) U.S. Cl.
CPC ......... *G09G 3/3266* (2013.01); *G02F 1/1368* (2013.01); *G02F 1/136286* (2013.01);
(Continued)

(58) Field of Classification Search
CPC ... G09G 2310/0297; G09G 2310/0264; G09G 2300/0452; G09G 2300/0804;
(Continued)

(56) References Cited

U.S. PATENT DOCUMENTS 7,746,313 B2 *  6/2010  Goto .................... G09G 3/3648
345/100
9,898,978 B2 *  2/2018  Guo ..................... G09G 3/3614
(Continued)

*Primary Examiner* — Dismery Mercedes

(57) ABSTRACT

A driving method of a display panel is provided, including setting the first red, first green, first blue, second red, second green, and second blue multiplexed signals. In the 2i–1th multiplexing period, the charging time of the sub-pixels corresponding to the switching units controlled by the first red, the first green, and the first blue multiplexed signals is earlier than that controlled by the second red, the second green, and the second blue multiplexed signals. While In the 2ith multiplexing period, the charging time of the sub-pixels corresponding to the switching units controlled by the first red, the first green, and the first blue multiplexed signals is later than that controlled by the second red, the second green, and the second blue multiplexed signals. The method will eliminate the stripe feeling of the scream picture displayed on the display panel and so improve the display quality.

10 Claims, 9 Drawing Sheets

(51) Int. Cl.
*G09G 3/36* (2006.01)
*G02F 1/1362* (2006.01)
*G02F 1/1368* (2006.01)
*H01L 27/32* (2006.01)
*G09G 3/20* (2006.01)

(52) U.S. Cl.
CPC ......... *G09G 3/2074* (2013.01); *G09G 3/3275* (2013.01); *G09G 3/3677* (2013.01); *G09G 3/3688* (2013.01); *H01L 27/3218* (2013.01); *H01L 27/3276* (2013.01); *G09G 2300/0804* (2013.01); *G09G 2310/0297* (2013.01)

(58) Field of Classification Search
CPC ......... G09G 2300/0426; G09G 3/2003; G09G 3/3607; G09G 3/3688; G09G 2320/02; G09G 2310/0202; G09G 2320/0242; G09G 2320/0233; G09G 2320/0252; G09G 3/2074; G09G 3/3648; G09G 3/3659; G09G 3/3266; G09G 3/3275; G06F 3/0412; G06F 3/0416; G06F 3/047; G02F 1/136286; G02F 1/13338
See application file for complete search history.

(56) References Cited

U.S. PATENT DOCUMENTS

| | | | |
|---|---|---|---|
| 10,242,634 B2* | 3/2019 | Sang | G09G 3/3275 |
| 10,304,401 B2* | 5/2019 | Zuo | G09G 3/3648 |
| 2007/0091050 A1* | 4/2007 | Katayama | G09G 3/3688 |
| | | | 345/98 |
| 2017/0061853 A1* | 3/2017 | Yang | G09G 3/22 |
| 2017/0076665 A1* | 3/2017 | Kim | G09G 3/3275 |
| 2017/0116910 A1* | 4/2017 | Miao | G09G 3/36 |
| 2017/0221436 A1* | 8/2017 | Guo | G09G 3/3607 |
| 2018/0151145 A1* | 5/2018 | Lee | G02F 1/136286 |
| 2018/0174533 A1* | 6/2018 | An | G09G 3/36 |
| 2019/0228730 A1* | 7/2019 | Cong | G09G 3/3688 |
| 2019/0347976 A1* | 11/2019 | Um | G09G 3/2003 |
| 2020/0168158 A1* | 5/2020 | Zheng | G09G 3/3266 |

* cited by examiner

DRIVING METHOD OF A DISPLAY PANEL

RELATED APPLICATIONS

This application is a National Phase of PCT Patent Application No. PCT/CN2018/122201 having International filing date of Dec. 19, 2018, which claims the benefit of priority of Chinese Patent Application No. 201811436769.2 filed on Nov. 28, 2018. The contents of the above applications are all incorporated by reference as if fully set forth herein in their entirety.

FIELD AND BACKGROUND OF THE INVENTION

The present invention relates to the field of display technologies, and in particular, to a driving method of a display panel.

With the development of display technology, flat display devices such as liquid crystal display (LCD) have gradually replaced cathode ray tube (CRT) display screens due to their high image quality, power saving, thin body and wide application range. LCD is widely used in mobile phones, televisions, personal digital assistants, digital cameras, notebook computers, desktop computers and other consumer electronic products, becoming the mainstream in display devices.

Most of the liquid crystal display devices on the market are backlight type liquid crystal display devices, which include liquid crystal display panels and backlight modules. The working principle of the liquid crystal display panel is to fill liquid crystal molecules between a thin film transistor array substrate (TFT Array Substrate) and a color filter (CF) substrate, and to apply driving voltage on the two substrates to control the rotation direction of the liquid crystal molecules, in order to refract the light of the backlight module to generate a picture.

In the driving structure of a conventional liquid crystal display device, one pixel electrode has a data line and a scan line (Gate Line), which can well control the opening of the gate in each scan line and the input of the data in each data line. However, as the resolution of the liquid crystal display panel increases, the numbers of data lines and scan lines also increase, which in turn lead to the situation that the area occupied by the fan-out wiring of the data lines increases, impacting the penetration rate and display effect. In order to solve this problem, the multiplexed drive architecture has been widely used, such as the 1 to 6 De-mux drive architecture. The so-called 1 to 6 De-mux drive architecture refers to the technology of the use of a data signal being 6 columns of pixels to perform charging, using the principle of time-sharing multiplexing. Referring to FIG. 1, a display panel of a present 1 to 6 Dex-mux driving architecture includes a plurality of driving units. Each of the driving units includes a plurality of pixels 100 arranged in a plurality of rows and four columns, 12 data lines 200, a plurality of scan lines 300, and a multiplex module 400. Each pixel 100 includes three sub-pixels 110 arranged in a row, and the three sub-pixels 110 are in order a red sub-pixel r, a green sub-pixel g, and a blue sub-pixel b. The sub-pixels 110 of a plurality of pixels 100 are arranged in a plurality of rows and 12 columns. The colors of the same column of sub-pixels 110 are the same. One data line 200 connects with one column of sub-pixels 110 correspondingly, and one scan line 300 connects with one row of sub-pixels 110 correspondingly. The multiplex module 400 includes 12 thin film transistors T10 corresponding to 12 columns of sub-pixels 110, respectively. The drains of the twelve thin film transistors T10 are respectively connected to the data lines 200 connected to the corresponding one row of the sub-pixels 110. The source electrode of the thin film transistor T10 corresponding to the odd column of sub-pixel 110 is connected to the Nth data signal DN, where N is a positive integer. The source electrode of the thin film transistor T10 corresponding to the even column of sub-pixel 110 is connected to the N+1th data signal DN+1. The gate electrode of the thin film transistor T10 corresponding to the red sub-pixel r in the first and second columns of pixels 100 is connected to the first red multiplexed signal MUX_R10. The gate electrode of the thin film transistor T10 corresponding to the green sub-pixel g in the first and second columns of pixels 100 is connected to the first green multiplexed signal MUX_G10. The gate electrode of the thin film transistor T10 corresponding to the blue sub-pixel b in the first and second columns of pixels 100 is connected to the first blue multiplexed signal MUX_B10. The gate electrode of the thin film transistor T10 corresponding to the red sub-pixel r in the third and fourth columns of pixels 100 is connected to the second red multiplexed signal MUX_R20. The gate electrode of the thin film transistor T10 corresponding to the green sub-pixel g in the third and fourth columns of pixels 100 is connected to the second green multiplexed signal MUX_G20. The gate electrode of the thin film transistor T10 corresponding to the blue sub-pixel b in the third and fourth columns of pixels 100 is connected to the second blue multiplexed signal MUX_B20.

The display panel includes a plurality of frame periods that are successively proceeded when the display panel is driven. Each frame period includes a plurality of line periods that are successively proceeded. The plurality of scan lines 300 are at high level voltage successively in a plurality of line periods. Referring to FIG. 2, in each row period, the first red multiplexed signal MUX_R10, the first green multiplexed signal MUX_G10, the first blue multiplexed signal MUX_B10, the second red multiplexed signal MUX_R20, the second green multiplexed signal MUX_G20 and the second blue multiplexed signal MUX_B20 successively generate a high level pulse, so that the data signal is transmitted to the corresponding sub-pixel 110 by opening the corresponding thin film transistor T10. This kind of driving method can reduce the area occupied by the data line fan-out wiring to achieve a narrow border. However, in each row period, the red sub-pixel r, the green sub-pixel g, and the blue sub-pixel b in the first column and the second column of the pixel 100 are always charged first; and the red sub-pixel r, the green sub-pixel g, and the blue sub-pixel b in the third column and the fourth column of the pixel 100 are charged later. The display effects of the sub-pixel 110 that are charged first are better than the display effects of the sub-pixel 110 that are charged later, with the result that the charging effects of the red sub-pixel r, the green sub-pixel g, and the blue sub-pixel b in the first column and the second column of the pixel 100 are better than the charging effects of the red sub-pixel r, the green sub-pixel g, and the blue sub-pixel b in the third column and the fourth column of the pixel 100. As shown in FIG. 3, a difference in luminance occurs between the first column and the second column of the pixel 100 and the third column and the fourth column of the pixel 100, finally with the result that the screen picture displayed on the display panel has a feel of stripes, which affect the display effect.

SUMMARY OF THE INVENTION

An object of the present invention is to provide a driving method of a display panel, which can eliminate the stripe feeling of the scream picture displayed on the display panel and so improve the display quality.

To achieve the above object, the present invention provides a driving method of a display panel, comprising the following steps:

step S1: providing a display panel; wherein said display panel includes a plurality of driving units; each of the driving units includes a plurality of pixels arranged in a plurality of rows and four columns, 12 data lines, and a multiplex module; each pixel includes three sub-pixels arranged in a row, and the three sub-pixels are in order a red sub-pixel, a green sub-pixel, and a blue sub-pixel; the sub-pixels of the plurality of pixels are arranged in a plurality of rows and 12 columns; the colors of the same column of the sub-pixels are the same; one data line connects with one column of the sub-pixels correspondingly; the multiplex module includes 12 switching elements corresponding to the 12 columns of the sub-pixels, respectively; output ends of the twelve switching elements are respectively connected to the data lines each connected to a corresponding one column of the sub-pixels; input ends of the switching elements corresponding to the odd columns of the sub-pixels are all connected together to receive signal from the nth data line, where n is a positive integer; input ends of the switching elements corresponding to the even columns of the sub-pixels are all connected together to receive signal from the n+1th data line; control ends of the switching elements corresponding to the red sub-pixels in the first and second columns of the pixels are connected together to receive a first red multiplexed signal; control ends of the switching elements corresponding to the green sub-pixels in the first and second columns of the pixels are connected together to receive a first green multiplexed signal; control ends of the switching elements corresponding to the blue sub-pixels in the first and second columns of the pixels are connected together to receive a first blue multiplexed signal; control ends of the switching elements corresponding to the red sub-pixels in the third and fourth columns of the pixels are connected together to receive a second red multiplexed signal; control ends of the switching elements corresponding to the green sub-pixels in the third and fourth columns of the pixels are connected together to receive a second green multiplexed signal; and control ends of the switching elements corresponding to the blue sub-pixels in the third and fourth columns of the pixels are connected together to receive a second blue multiplexed signal;

step S2: entering a 2i−1th multiplexing period; wherein said 2i−1th multiplexing period includes p first row periods; and in each first row period, the first red multiplexed signal, the first green multiplexed signal, the first blue multiplexed signal, the second red multiplexed signal, the second green multiplexed signal, and the second blue multiplexed signal successively generate a high-level pulse, where i and p are positive integers; and step S3: entering a 2ith multiplexing period; wherein said 2ith multiplex period includes p second row periods; and in each second row period, the second red multiplexed signal, the second green multiplexed signal, the second blue multiplexed signal, the first red multiplexed signal, the first green multiplexed signal, and the first blue multiplexed signal successively generate a high-level pulse.

Each of the driving units further includes a plurality of scan lines; and one row of the sub-pixels are correspondingly connected to one scan line.

Said 2i−1th multiplexing period includes 1 first row period; and said 2ith multiplexing period includes 1 second row period.

In the 2i−1th multiplexing period, a voltage on the qth scan line is at high potential, and voltages on the scan lines other than the qth scan line among the plurality of scan lines are all at low potential, where q is a positive integer; and In the 2ith multiplexing period, a voltage on the q+1th scan line is at high potential, and voltages on the scan lines other than the q+1th scan line among the plurality of scan lines are all at low potential.

Said 2i−1th multiplexing period includes two successively performed first row periods; and said 2ith multiplexing period includes two successively performed second row periods.

In the first of the two first row periods of said 2i−1th multiplexing period, a voltage on the qth scan line is at high potential, and voltages on the scan lines other than the qth scan line among the plurality of scan lines are all at low potential, where q is a positive integer; in the second of the two first row periods of said 2i−1th multiplexing period, a voltage on the q+1th scan line is at high potential, and voltages on the scan lines other than the q+1th scan line among the plurality of scan lines are all at low potential;

in the first of the two second row periods of said 2ith multiplexing period, a voltage on the q+2th scan line is at high potential, and voltages on the scan lines other than the q+2th scan line among the plurality of scan lines are all at low potential; and in the second of the two second row periods of said 2ith multiplexing period, a voltage on the q+3th scan line is at high potential, and voltages on the scan lines other than the q+3th scan line among the plurality of scan lines are all at low potential.

Durations of the high-level pulse of each of the first red multiplexed signal, the first green multiplexed signal, the first blue multiplexed signal, the second red multiplexed signal, the second green multiplexed signal, and the second blue multiplexed signal are equal.

Said display panel is a liquid crystal display panel or an OLED display panel.

The first red multiplexed signal, the first green multiplexed signal, the first blue multiplexed signal, the second red multiplexed signal, the second green multiplexed signal, the second blue multiplexed signal, the nth data signal, and the n+1th data signal are provided by an external driving chip.

Said switching elements each are a thin film transistor, the control ends of the switching elements are gates of the thin film transistors, the input ends of the switching elements are sources of the thin film transistors, and the output ends of the switching sources are drains of the thin film transistors.

The beneficial effects of the invention: the driving method of the display panel of the present invention sets the first red, first green, first blue, second red, second green, and second blue multiplexed signals to make the following. In the 2i−1th multiplexing period, the charging time of the sub-pixel corresponding to the switching unit controlled by the first red, the first green, and the first blue multiplexed signals is earlier than that controlled by the second red, the second green, and the second blue multiplexed signals. While In the 2ith multiplexing period, the charging time of the sub-pixel corresponding to the switching unit controlled by the first red, the first green, and the first blue multiplexed signals is later than that controlled by the second red, the second green, and the second blue multiplexed signals, thereby eliminating the stripe feeling of the scream picture displayed on the display panel and so improving the display quality.

BRIEF DESCRIPTION OF THE SEVERAL VIEWS OF THE DRAWINGS

For a better understanding of the features and technical aspects of the present invention, the following detailed description and drawings regarding the present invention should be referred to. The drawings are provided for purposes of illustration and description only and are not intended to limit the invention.

In the drawings.

DESCRIPTION OF SPECIFIC EMBODIMENTS OF THE INVENTION

In order to further clarify the technical means and effects of the present invention, the following detailed description will be made in conjunction with the preferred embodiments of the invention and the accompanying drawings.

Figure 1:
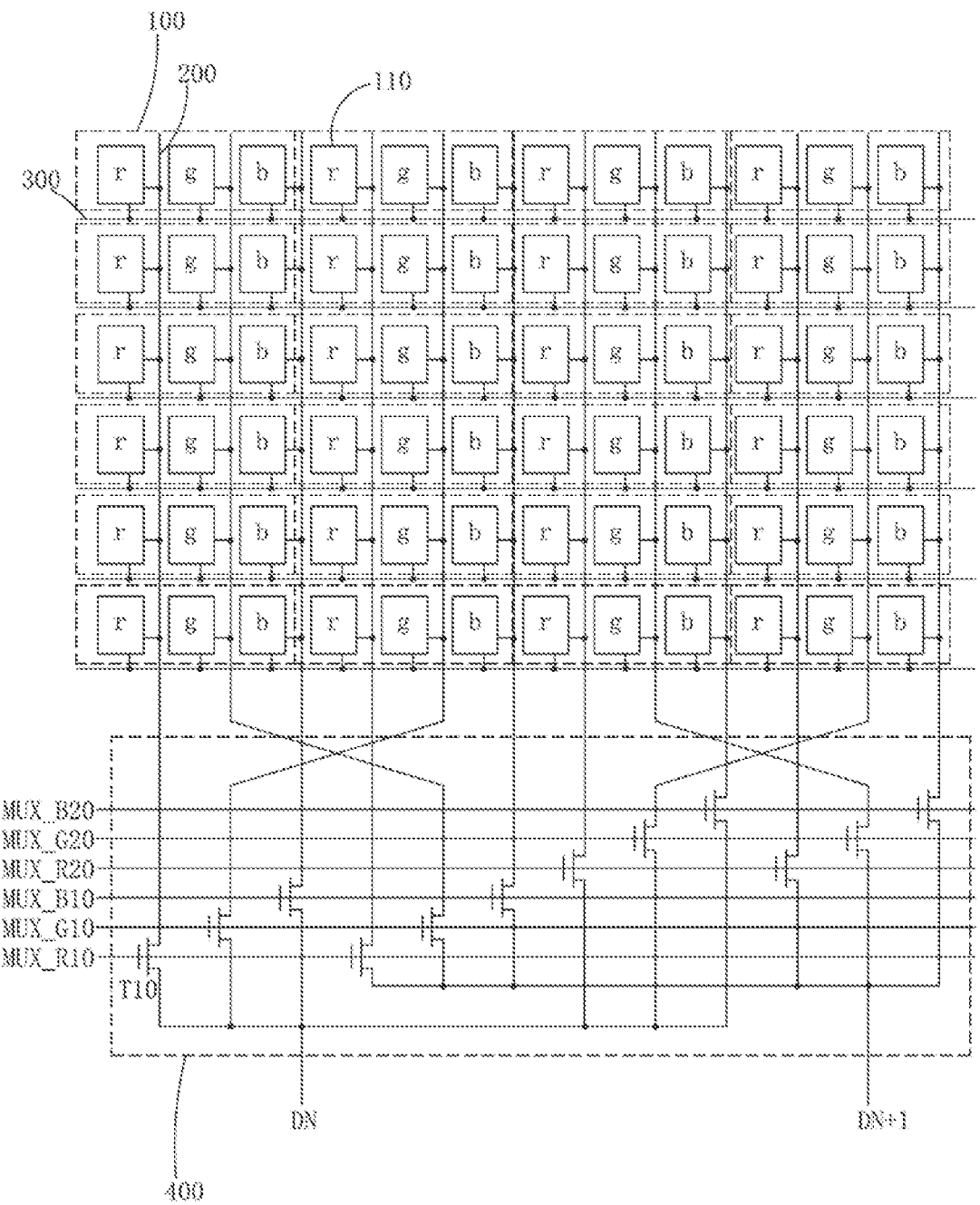
FIG. 1 is a schematic structural diagram of a display panel of a present 1 to 6 Dex-mux driving architecture.
Figure 2:
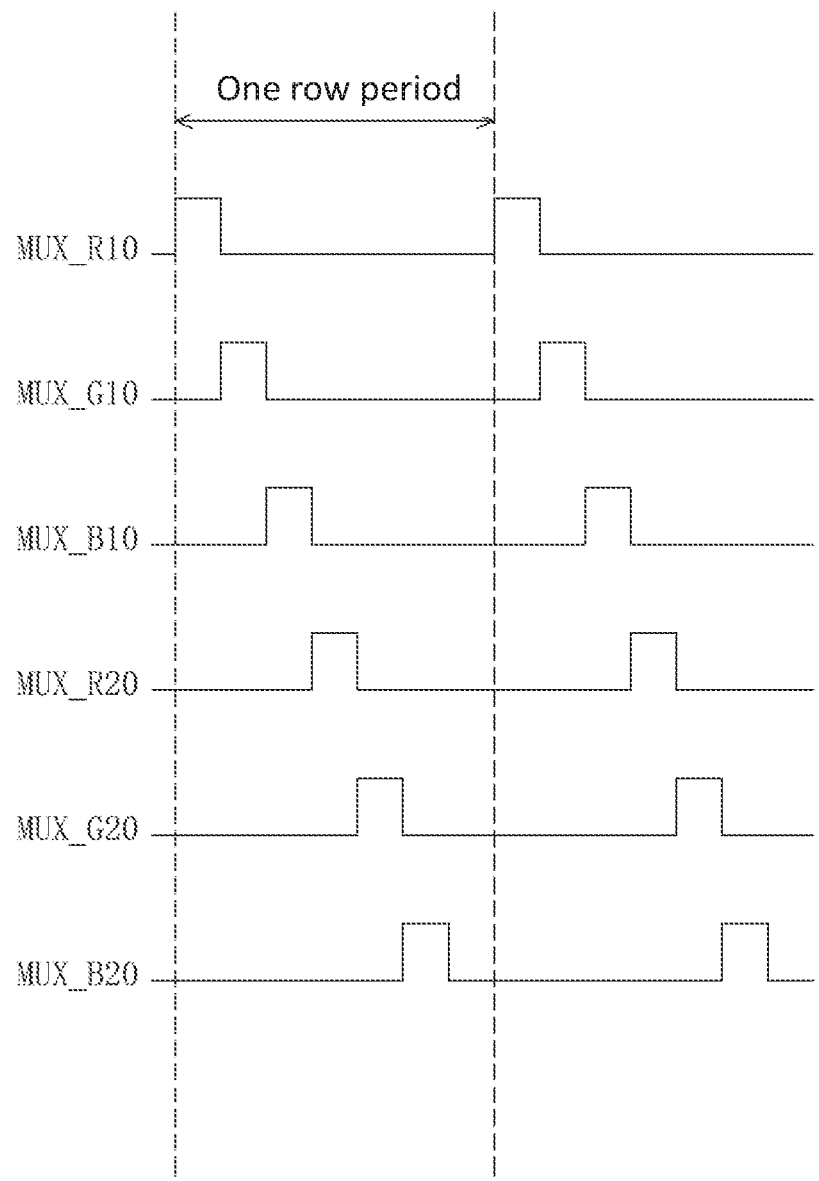
FIG. 2 is a driving timing chart of the display panel shown in FIG. 1.
Figure 3:
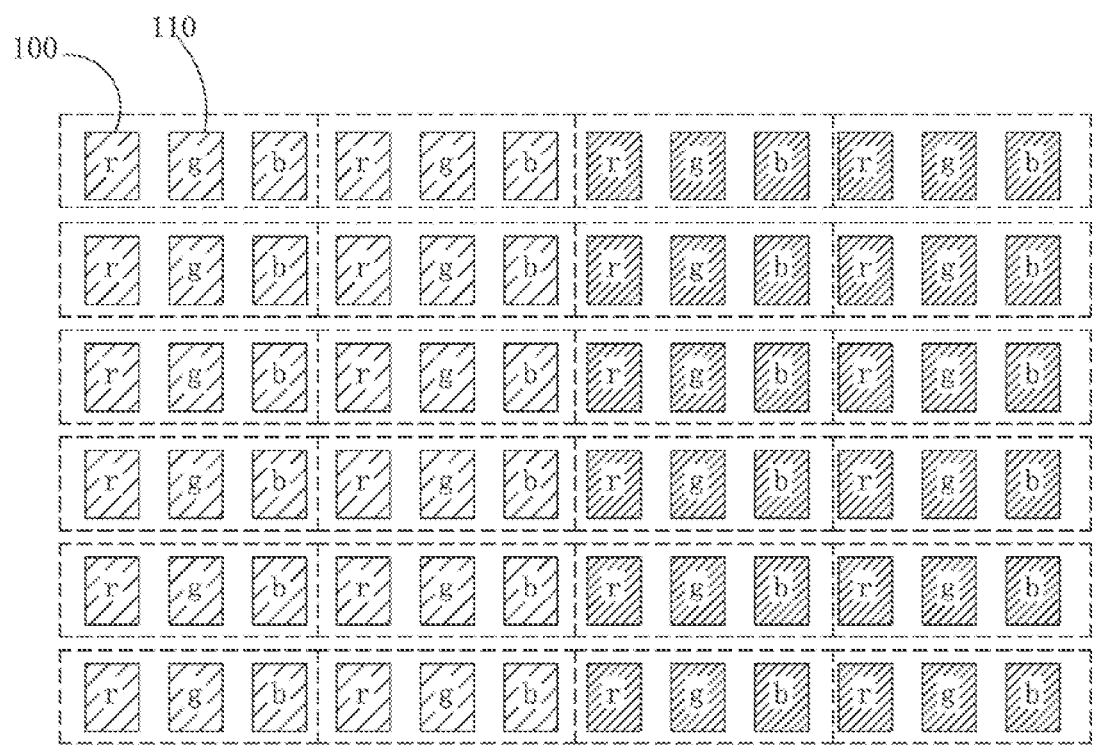
FIG. 3 is a view showing a display effect of the display panel shown in FIG. 1.
Figure 4:
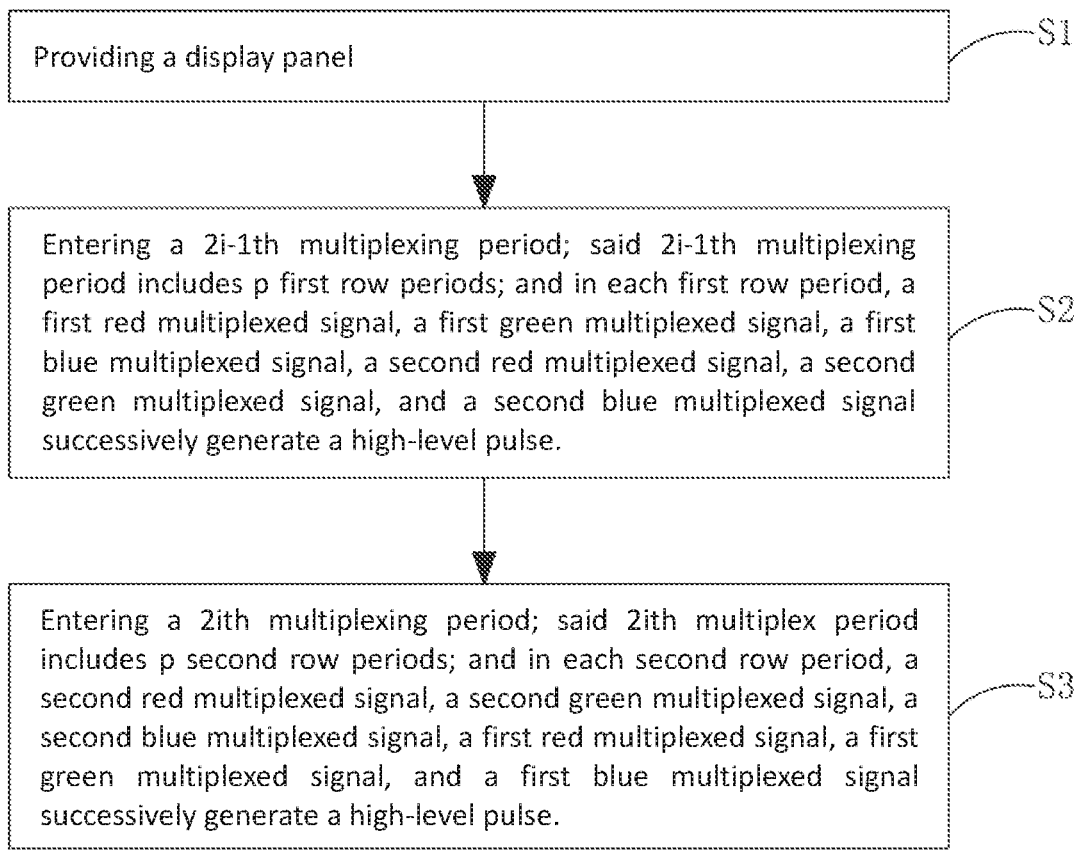
FIG. 4 is a flow chart of a driving method of a display panel of the present invention.
Figure 5:
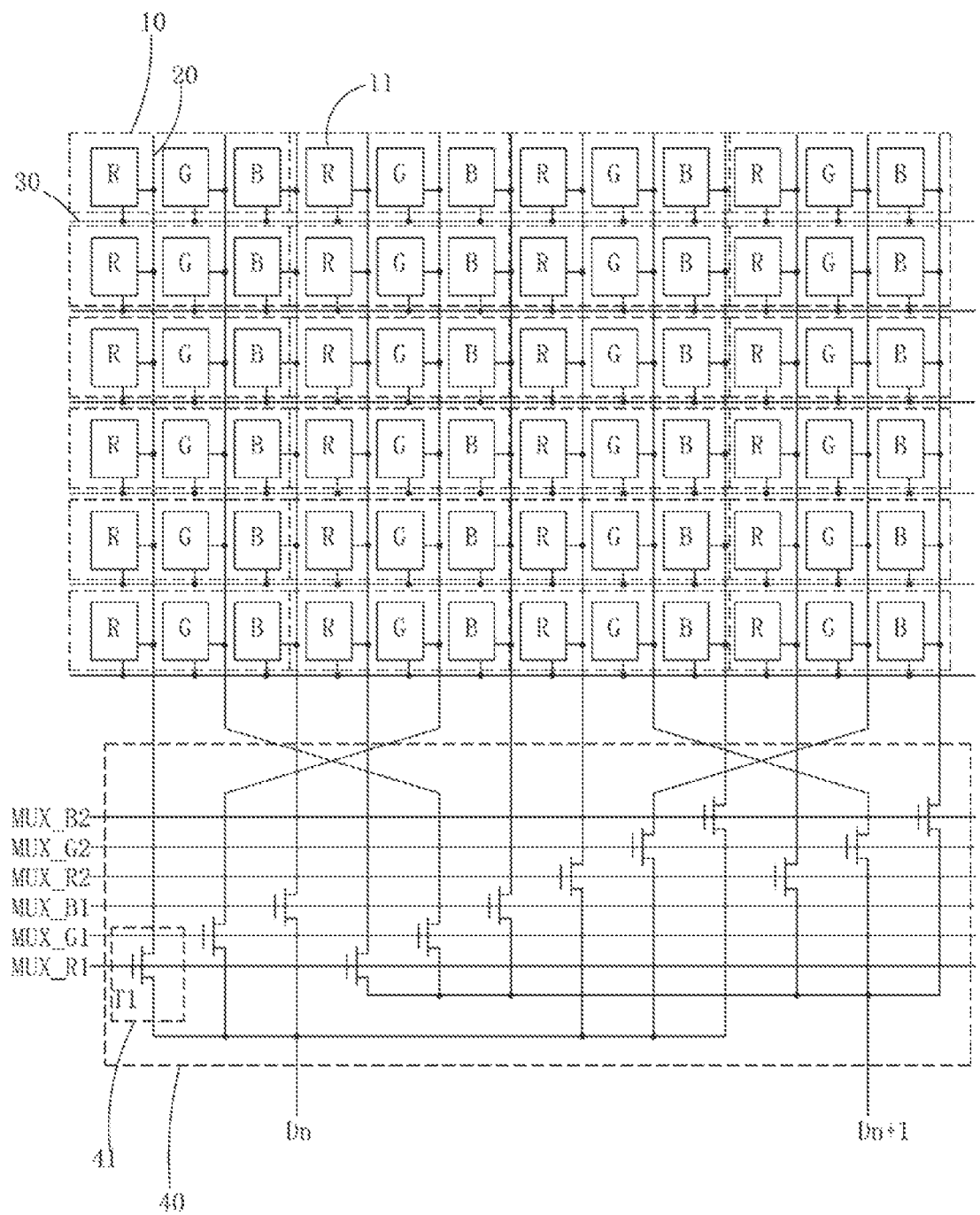
FIG. 5 is a schematic diagram of step S1 of the driving method of the display panel of the present invention.

Referring to FIG. 4, the invention provides a driving method of a display panel, comprising the following steps:

Step S1: referring to FIG. 5, a display panel is provided.

The so-called display panel includes a plurality of driving units. Each of the driving units includes a plurality of pixels 10 arranged in a plurality of rows and four columns, 12 data lines 20, and a multiplex module 40. Each pixel 10 includes three sub-pixels 11 arranged in a row, and the three sub-pixels 11 are in order a red sub-pixel R, a green sub-pixel G, and a blue sub-pixel B. The sub-pixels 11 of the plurality of pixels 10 are arranged in a plurality of rows and 12 columns. The colors of the same column of the sub-pixels 11 are the same. One data line 20 connects with one column of the sub-pixels 11 correspondingly. The multiplex module 40 includes 12 switching elements 41 corresponding to the 12 columns of the sub-pixels 11, respectively. Output ends of the twelve switching elements 41 are respectively connected to the data lines 20 each connected to a corresponding one column of the sub-pixels 10. Input ends of the switching elements 41 corresponding to the odd columns of the sub-pixels 11 are all connected together to receive signal from the nth data line Dn, where n is a positive integer. Input ends of the switching elements 41 corresponding to the even columns of the sub-pixels 11 are all connected together to receive signal from the n+1th data line Dn+1. Control ends of the switching elements 41 corresponding to the red sub-pixels R in the first and second columns of the pixels 10 are connected together to receive a first red multiplexed signal MUX_R1. Control ends of the switching elements 41 corresponding to the green sub-pixels G in the first and second columns of the pixels 10 are connected together to receive a first green multiplexed signal MUX_G1. Control ends of the switching elements 41 corresponding to the blue sub-pixels B in the first and second columns of the pixels 10 are connected together to receive a first blue multiplexed signal MUX_B1. Control ends of the switching elements 41 corresponding to the red sub-pixels R in the third and fourth columns of the pixels 10 are connected together to receive a second red multiplexed signal MUX_R2. Control ends of the switching elements 41 corresponding to the green sub-pixels G in the third and fourth columns of the pixels 10 are connected together to receive a second green multiplexed signal MUX_G2. Control ends of the switching elements 41 corresponding to the blue sub-pixels B in the third and fourth columns of the pixels 10 are connected together to receive a second blue multiplexed signal MUX_B2.

Specifically, the display panel may be a liquid crystal display panel or an OLED display panel.

Specifically, the switching elements 41 each are a thin film transistor T1, the control ends of the switching elements 41 are gates of the thin film transistors T1, the input ends of the switching elements 41 are sources of the thin film transistors T1, and the output ends of the switching sources 41 are drains of the thin film transistors T1.

Step S2: entering a 2i−1th multiplexing period.

The 2i−1th multiplexing period includes p first row periods. In each first row period, the first red multiplexed signal MUX_R1, the first green multiplexed signal MUX_G1, the first blue multiplexed signal MUX_B1, the second red multiplexed signal MUX_R2, the second green multiplexed signal MUX_G2, and the second blue multiplexed signal MUX_B2 successively generate a high-level pulse, where i and p are positive integers.

Figure 6:
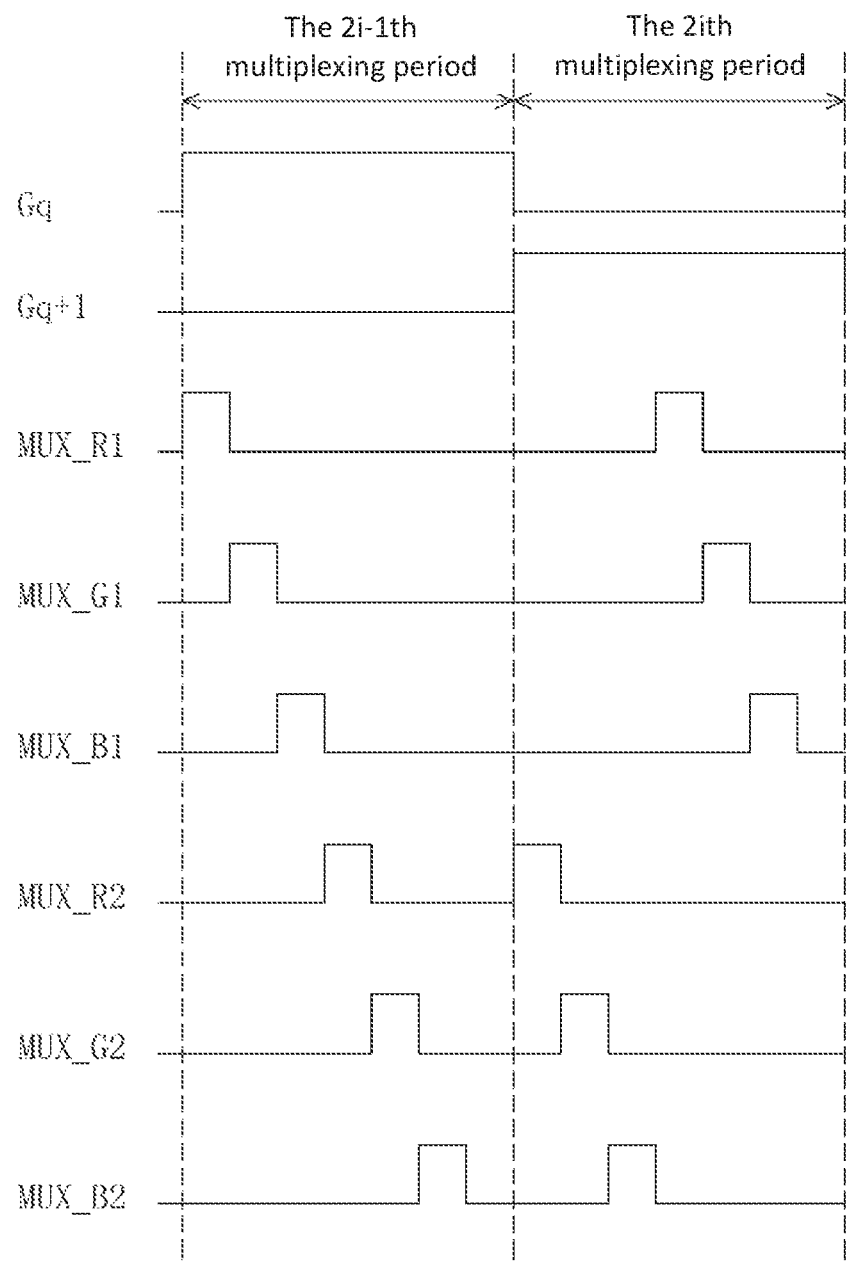
FIG. 6 is a schematic diagram of step S2 and step S3 of the first embodiment of the driving method of the display panel of the present invention.

Specifically, referring to FIG. 6, in the first embodiment of the present invention, p is 1, that is, in the step S2, the 2i−1th multiplexing period includes 1 first row period. In the 2i−1th multiplexing period, a voltage Gq on the qth scan line 30 is at high potential, and voltages on the scan lines 30 other than the qth scan line 30 among the plurality of scan lines 30 are all at low potential, where q is a positive integer. That is, in the first embodiment of the present invention, the 2i−1th multiplexing period corresponds to the ON timing of the qth row sub-pixel 11 corresponding to the qth scan line 30.

Specifically, the durations of the high-level pulse of each of the first red multiplexed signal MUX_R1, the first green multiplexed signal MUX_G1, the first blue multiplexed signal MUX_B1, the second red multiplexed signal MUX_R2, the second green multiplexed signal MUX_G2, and the second blue multiplexed signal MUX_B2 are equal.

Step S3: entering a 2ith multiplexing period.

The 2ith multiplex period includes p second row periods. In each second row period, the second red multiplexed signal MUX_R2, the second green multiplexed signal MUX_G2, the second blue multiplexed signal MUX_B2, the first red multiplexed signal MUX_R1, the first green multiplexed signal MUX_G1, and the first blue multiplexed signal MUX_B1 successively generate a high-level pulse.

Specifically, referring to FIG. 6, in the first embodiment of the present invention, the 2ith multiplexing period includes 1 second row period. In the 2ith multiplexing period, a voltage Gq+1 on the q+1th scan line 30 is at high potential, and voltages on the scan lines 30 other than the q+1th scan line 30 among the plurality of scan lines 30 are all at low potential. That is, in the first embodiment of the present invention, the 2ith multiplexing period corresponds to the ON timing of the q+1th row sub-pixel 11 corresponding to the q+1th scan line 30.

Specifically, the first red multiplexed signal MUX_R1, the first green multiplexed signal MUX_G1, the first blue multiplexed signal MUX_B1, the second red multiplexed signal MUX_R2, the second green multiplexed signal MUX_G2, the second blue multiplexed signal MUX_B2, the nth data signal Dn, and the n+1th data signal Dn+1 are provided by an external driving chip.

Figure 7:
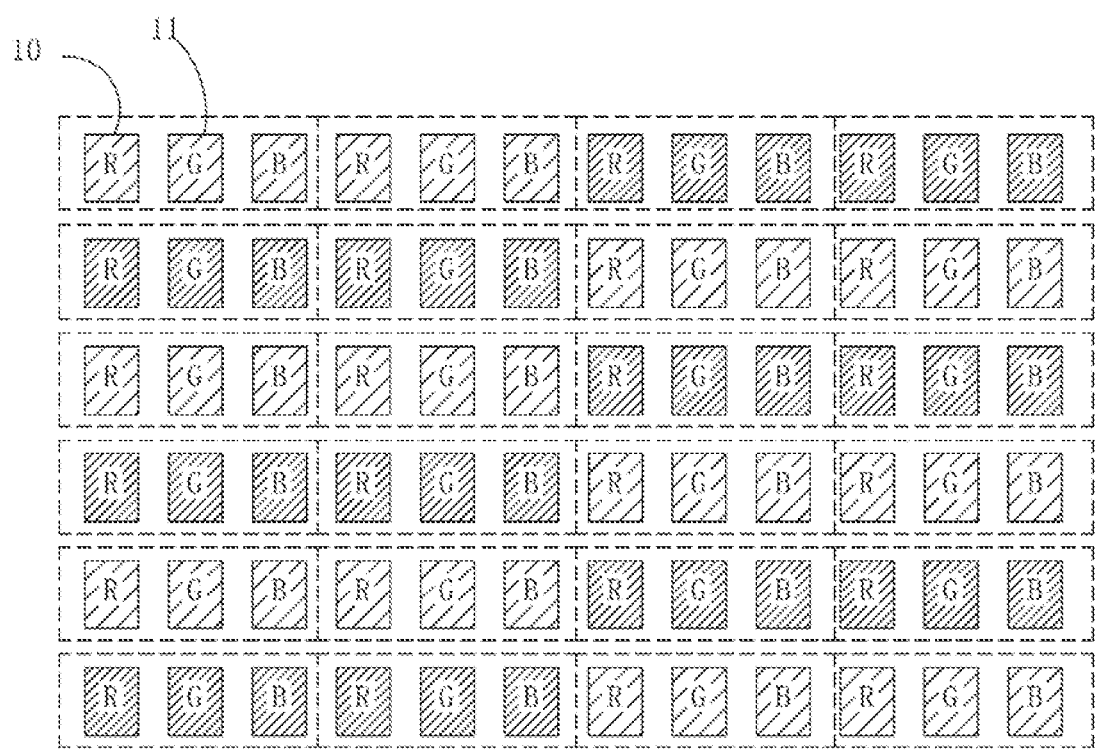
FIG. 7 is a view showing a display effect of a first embodiment of a driving method of a display panel of the present invention.

It should be noted that, in the first embodiment of the driving method of the display panel of the present invention, through the 2i−1th multiplexing period, that is, in the opening time of the qth row of sub-pixel 11 corresponding to the qth scan line 30, the first red multiplexed signal MUX_R1, the first green multiplexed signal MUX_G1, the first blue multiplexed signal MUX_B1, the second red multiplexed signal MUX_R2, the second green multiplexed signal MUX_G2, and the second blue multiplexed signal MUX_B2 successively generate a high level pulse. Therefore, in the 2i−1th multiplexing period, the charging time of the sub-pixel 11 corresponding to the switching unit 41 controlled by the first red multiplexed signal MUX_R1, the first green multiplexed signal MUX_G1, and the first blue multiplexed signal MUX_B1, that is, the charging time of the sub-pixel 11 in the first column and the second column of the pixels 10 is earlier than that controlled by the second red multiplexed signal MUX_R2, the second green multiplexed signal MUX_G2, and the second blue multiplexed signal MUX_B2, that is, the charging time of the sub-pixel 11 in the third column and the fourth column of the pixels 10. While in the 2ith multiplexing period, that is, in the opening time of the q+1th row of sub-pixel 11 corresponding to the q+1th scan line 30, the second red multiplexed signal MUX_R2, the second green multiplexed signal MUX_G2, the second blue multiplexed signal MUX_B2, the first red multiplexed signal MUX_R1, the first green multiplexed signal MUX_G1, and the first blue multiplexed signal MUX_B1 successively generate a high level pulse. Therefore, in the 2ith multiplexing period, the charging time of the sub-pixel 11 corresponding to the switching unit 41 controlled by the first red multiplexed signal MUX_R1, the first green multiplexed signal MUX_G1, and the first blue multiplexed signal MUX_B1, that is, the charging time of the sub-pixel 11 in the first column and the second column of the pixels 10 is later than that controlled by the second red multiplexed signal MUX_R2, the second green multiplexed signal MUX_G2, and the second blue multiplexed signal MUX_B2, that is, the charging time of the sub-pixel 11 in the third column and the fourth column of the pixels 10. Therefore, when the screen displays, referring to FIG. 7, in the same column of pixels 10, the pixels 10 with good charging effect and the pixels 10 with poor charging effect are alternately arranged and superimposed on each other, thereby eliminating the stripe feeling of the scream picture displayed on the display panel and so effectively improving the display quality.

Figure 8:
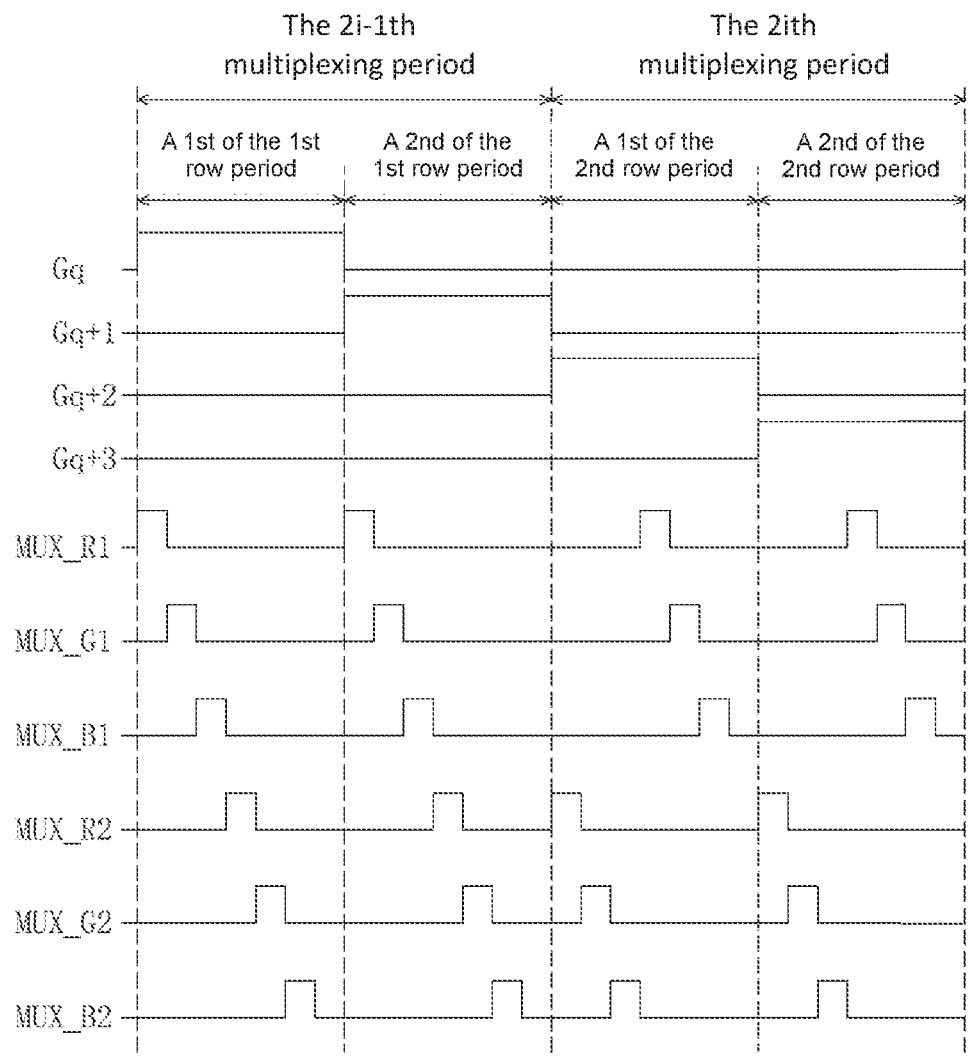
FIG. 8 is a schematic diagram of step S2 and step S3 of the second embodiment of the driving method of the display panel of the present invention.

Referring to FIG. 5 in conjunction with FIG. 8, the second embodiment of the driving method of the display panel of the present invention is different from the above-described first embodiment in that:

Referring to FIG. 8, in step S2, the 2i−1th multiplexing period includes two successively performed first row periods, and the 2ith multiplexing period includes two successively performed second row periods. In the first of the two first row periods of the 2i−1th multiplexing period, a voltage on the qth scan line 30 is at high potential, and voltages on the scan lines 30 other than the qth scan line 30 among the plurality of scan lines 30 are all at low potential, where q is a positive integer. In the second of the two first row periods of the 2i−1th multiplexing period, a voltage on the q+1th scan line is at high potential, and voltages on the scan lines 30 other than the q+1th scan line 30 among the plurality of scan lines 30 are all at low potential. That is, in the second embodiment of the present invention, the two first row periods of the 2i−1th multiplexing period respectively correspond to the opening time of the qth row of sub-pixels 11 corresponding to the qth scan line 30 and correspond to the opening time of the q+1th row of sub-pixels 11 corresponding to the q+1th scan line 30.

Referring to FIG. 8, in step S3, In the first of the two second row periods of the 2ith multiplexing period, a voltage Gq+2 on the q+2th scan line 30 is at high potential, and voltages on the scan lines 30 other than the q+2th scan line 30 among the plurality of scan lines 30 are all at low potential. In the second of the two second row periods of the 2ith multiplexing period, a voltage Gq+3 on the q+3th scan line 30 is at high potential, and voltages on the scan lines 30 other than the q+3th scan line 30 among the plurality of scan lines 30 are all at low potential. That is, in the second embodiment of the present invention, the two second row periods of the 2ith multiplexing period respectively correspond to the opening time of the q+2th row of sub-pixels 11 corresponding to the q+2th scan line 30 and correspond to the opening time of the q+3th row of sub-pixels 11 corresponding to the q+3th scan line 30.

The rest are the same as the first embodiment described above, and are not described herein again.

Figure 9:
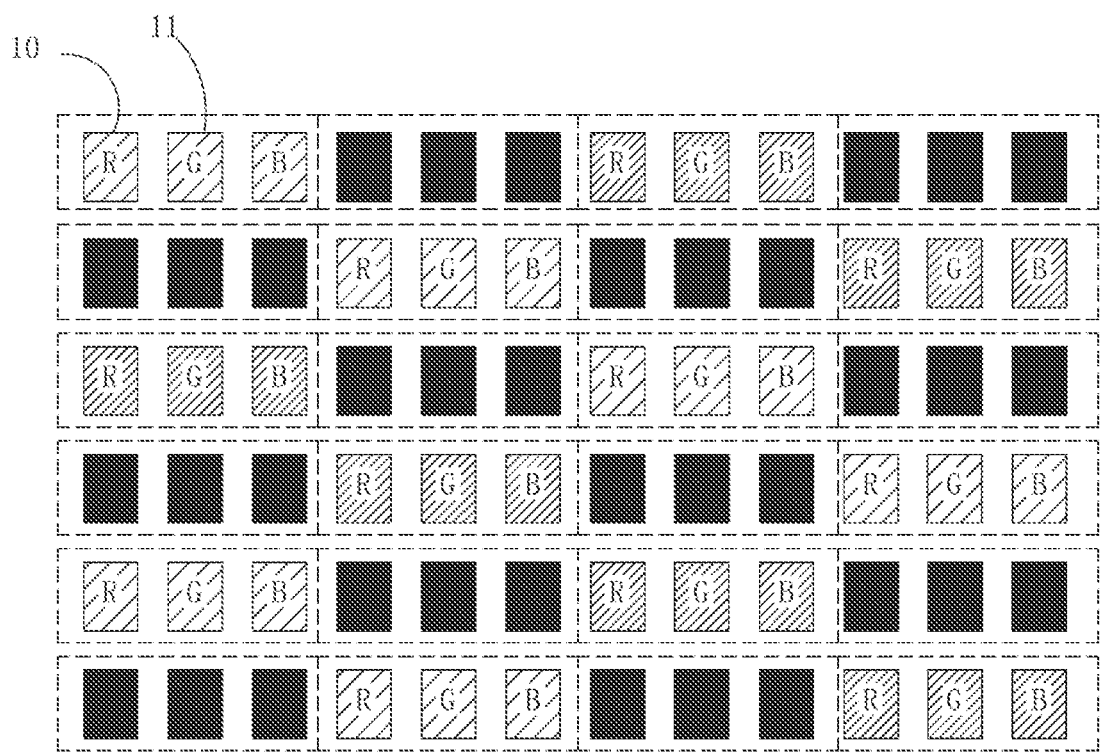
FIG. 9 is a view showing the display effect of the second embodiment of the driving method of the display panel of the present invention.

It should be noted that the display panel sometimes displays a bright and dark alternating screen picture as shown in FIG. 9. At this time, the pixels 10 of the odd-numbered rows and odd-numbered columns and of the even-numbered rows and even-numbered columns are in a bright state with emitting light, and the pixels 10 of the odd-numbered rows and even-numbered columns and of the even-numbered rows and odd-numbered columns are in a dark state without emitting light. At this time, if the driving is still performed in the manner of the first embodiment described above, in the same column of pixels 10, the charging effects of the pixels 10 in the bright state are the same. The charging effects of the pixels 10 in a bright state in different columns of pixels 10 are different, so the stripe problem still comes into existence. Hence, in the second embodiment of the driving method of the display panel of the present invention, through the 2i−1th multiplexing period, that is, in the opening time of the qth row of sub-pixel 11 corresponding to the qth scan line 30 and the opening time of the q+1th row of sub-pixel 11 corresponding to the q+1th scan line 30, the first red multiplexed signal MUX_R1, the first green multiplexed signal MUX_G1, the first blue multiplexed signal MUX_B1, the second red multiplexed signal MUX_R2, the second green multiplexed signal MUX_G2, and the second blue multiplexed signal MUX_B2 successively generate a high level pulse and then successively generate a high level pulse again. Therefore, in the 2i−1th multiplexing period, the charging time of the sub-pixel 11 corresponding to the switching unit 41 controlled by the first red multiplexed signal MUX_R1, the first green multiplexed signal MUX_G1, and the first blue multiplexed signal MUX_B1, that is, the charging time of the sub-pixel 11 in the first column and the second column of the pixels 10 is earlier than that controlled by the second red multiplexed signal MUX_R2, the second green multiplexed signal MUX_G2, and the second blue multiplexed signal MUX_B2, that is, the charging time of the sub-pixel 11 in the third column and the fourth column of the pixels 10. While in the 2ith multiplexing period, that is, in the opening time of the q+2th row of sub-pixel 11 corresponding to the q+2th scan line 30 and the opening time of the q+2th row of sub-pixel 11 corresponding to the q+2th scan line 30, the second red multiplexed signal MUX_R2, the second green multiplexed signal MUX_G2, the second blue multiplexed signal MUX_B2, the first red multiplexed signal MUX_R1, the first green multiplexed signal MUX_G1, and the first blue multiplexed signal MUX_B1 successively generate a high level pulse. Therefore, in the 2ith multiplexing period, the charging time of the sub-pixel 11 corresponding to the switching unit 41 controlled by the first red multiplexed signal MUX_R1, the first green multiplexed signal MUX_G1, and the first blue multiplexed signal MUX_B1, that is, the charging time of the sub-pixel 11 in the first column and the second column of the pixels 10 is later than that controlled by the second red multiplexed signal MUX_R2, the second green multiplexed signal MUX_G2, and the second blue multiplexed signal MUX_B2, that is, the charging time of the sub-pixel 11 in the third column and the fourth column of the pixels 10. Therefore, when the screen displays, referring to FIG. 9, a column of pixels 10 is divided into a plurality of pixel groups, each of which includes two pixels 10, and the charging effects of the two pixels 10 are consistent. The pixels 10 in any two adjacent pixel groups have different charging effects. Therefore when the screen picture with alternating light and dark is displayed, in the same column of pixels 10, the pixels 10 with better charging effect and in a bright state and the pixels 10 with poor charging effect and in a bright state are alternately arranged and superimposed on each other, thereby eliminating the stripe feeling of the scream picture displayed on the display panel and so effectively improving the display quality.

In addition, in other embodiments of the present invention, a positive integer greater than 2 may also be selected for p according to actual conditions, and does not affect the implementation of the present invention.

In summary, the driving method of the display panel of the present invention sets the first red, first green, first blue, second red, second green, and second blue multiplexed signals to make the following. In the 2i−1th multiplexing period, the charging time of the sub-pixel corresponding to the switching unit controlled by the first red, the first green, and the first blue multiplexed signals is earlier than that controlled by the second red, the second green, and the second blue multiplexed signals. While In the 2ith multiplexing period, the charging time of the sub-pixel corresponding to the switching unit controlled by the first red, the first green, and the first blue multiplexed signals is later than that controlled by the second red, the second green, and the second blue multiplexed signals, thereby eliminating the stripe feeling of the scream picture displayed on the display panel and so improving the display quality.

In view of the above, various other changes and modifications may be made by those skilled in the art, and all such changes and modifications are intended to fall within the scope of the appended claims.

What is claimed is:

1. A driving method of a display panel, comprising the following steps:
    step S1: providing a display panel; wherein
    said display panel includes a plurality of driving units;
        each of the driving units includes a plurality of pixels arranged in a plurality of rows and four columns, 12 data lines, and a multiplex module; each pixel includes three sub-pixels arranged in a row, and the three sub-pixels are in order a red sub-pixel, a green sub-pixel, and a blue sub-pixel; the sub-pixels of the plurality of pixels are arranged in a plurality of rows and 12 columns; the colors of the same column of the sub-pixels are the same; one data line connects with one column of the sub-pixels correspondingly; the multiplex module includes 12 switching elements corresponding to the 12 columns of the sub-pixels, respectively; output ends of the twelve switching elements are respectively connected to the data lines each connected to a corresponding one column of the sub-pixels; input ends of the switching elements corresponding to the odd columns of the sub-pixels are all connected together to receive signal from the nth data line, where n is a positive integer; input ends of the switching elements corresponding to the even columns of the sub-pixels are all connected together to receive signal from the n+1th data line; control ends of the switching elements corresponding to the red sub-pixels in the first and second columns of the pixels are connected together to receive a first red multiplexed signal; control ends of the switching elements corresponding to the green sub-pixels in the first and second columns of the pixels are connected together to receive a first green multiplexed signal; control ends of the switching elements corresponding to the blue sub-pixels in the first and second columns of the pixels are connected together to receive a first blue multiplexed signal; control ends of the switching elements corresponding to the red sub-pixels in the third and fourth columns of the pixels are connected together to receive a second red multiplexed signal; control ends of the switching elements corresponding to the green sub-pixels in the third and fourth columns of the pixels are connected together to receive a second green multiplexed signal; and control ends of the switching elements corresponding to the blue sub-pixels in the third and fourth columns of the pixels are connected together to receive a second blue multiplexed signal;
    step S2: entering a 2i−1th multiplexing period; wherein
    said 2i−1th multiplexing period includes p first row periods; and in each first row period, the first red multiplexed signal, the first green multiplexed signal, the first blue multiplexed signal, the second red multiplexed signal, the second green multiplexed signal, and the second blue multiplexed signal successively generate a first high-level pulse and then successively generate a second high level pulse again, where i and p are positive integers; and
    step S3: entering a 2ith multiplexing period; wherein
    said 2ith multiplex period includes p second row periods; and in each second row period, the second red multiplexed signal, the second green multiplexed signal, the second blue multiplexed signal, the first red multiplexed signal, the first green multiplexed signal, and the first blue multiplexed signal successively generate a high-level pulse.

2. A driving method of a display panel as claimed in claim 1, wherein each of the driving units further includes a plurality of scan lines; and one row of the sub-pixels are correspondingly connected to one scan line.

3. A driving method of a display panel as claimed in claim 2, wherein said 2i–1th multiplexing period includes 1 first row period; and said 2ith multiplexing period includes 1 second row period.

4. A driving method of a display panel as claimed in claim 3, wherein in the 2i–1th multiplexing period, a voltage on qth scan line is at high potential, and voltages on the scan lines other than the qth scan line among the plurality of scan lines are all at low potential, where q is a positive integer; and in the 2ith multiplexing period, a voltage on the q+1th scan line is at high potential, and voltages on the scan lines other than the q+1th scan line among the plurality of scan lines are all at low potential.

5. A driving method of a display panel as claimed in claim 2, wherein said 2i–1th multiplexing period includes two successively performed first row periods; and said 2ith multiplexing period includes two successively performed second row periods.

6. A driving method of a display panel as claimed in claim 5, wherein in the first of the two first row periods of said 2i–1th multiplexing period, a voltage on qth scan line is at high potential, and voltages on the scan lines other than the qth scan line among the plurality of scan lines are all at low potential, where q is a positive integer; in the second of the two first row periods of said 2i–1th multiplexing period, a voltage on the q+1th scan line is at high potential, and voltages on the scan lines other than the q+1th scan line among the plurality of scan lines are all at low potential;

in the first of the two second row periods of said 2ith multiplexing period, a voltage on the q+2th scan line is at high potential, and voltages on the scan lines other than the q+2th scan line among the plurality of scan lines are all at low potential; and in the second of the two second row periods of said 2ith multiplexing period, a voltage on the q+3th scan line is at high potential, and voltages on the scan lines other than the q+3th scan line among the plurality of scan lines are all at low potential.

7. A driving method of a display panel as claimed in claim 1, wherein durations of the high-level pulse of each of the first red multiplexed signal, the first green multiplexed signal, the first blue multiplexed signal, the second red multiplexed signal, the second green multiplexed signal, and the second blue multiplexed signal are equal.

8. A driving method of a display panel as claimed in claim 1, wherein said display panel is a liquid crystal display panel or an OLED display panel.

9. A driving method of a display panel as claimed in claim 1, wherein the first red multiplexed signal, the first green multiplexed signal, the first blue multiplexed signal, the second red multiplexed signal, the second green multiplexed signal, the second blue multiplexed signal, the nth data signal, and the n+1th data signal are provided by an external driving chip.

10. A driving method of a display panel as claimed in claim 1, wherein said switching elements each are a thin film transistor, the control ends of the switching elements are gates of the thin film transistors, the input ends of the switching elements are sources of the thin film transistors, and the output ends of the switching sources are drains of the thin film transistors.

* * * * *